United States Patent
Ryou et al.

(10) Patent No.: US 7,277,461 B2
(45) Date of Patent: Oct. 2, 2007

(54) DIELECTRIC VCSEL GAIN GUIDE

(75) Inventors: Jae-Hyun Ryou, Maple Grove, MN (US); Gyoungwon Park, Medina, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/607,629

(22) Filed: Jun. 27, 2003

(65) Prior Publication Data
US 2004/0264536 A1  Dec. 30, 2004

(51) Int. Cl.
*H01S 5/00* (2006.01)
(52) U.S. Cl. ............... 372/46.01; 372/45.01
(58) Field of Classification Search ............ 372/43.01, 372/45.01, 75
See application file for complete search history.

(56) References Cited

U.S. PATENT DOCUMENTS

| | | | |
|---|---|---|---|
| 4,317,085 A | 2/1982 | Brunham et al. | |
| 4,466,694 A | 8/1984 | MacDonald | |
| 4,660,207 A | 4/1987 | Svilans | |
| 4,675,058 A | 6/1987 | Plaster | |
| 4,784,722 A | 11/1988 | Liau et al. | |
| 4,885,592 A | 12/1989 | Kofol et al. | |
| 4,901,327 A | 2/1990 | Bradley | |
| 4,943,970 A | 7/1990 | Bradley | |
| 4,956,844 A | 9/1990 | Goodhue et al. | |
| 5,031,187 A | 7/1991 | Orenstein et al. | |
| 5,052,016 A | 9/1991 | Mahbobzadeh | |
| 5,056,098 A | 10/1991 | Anthony et al. | |
| 5,062,115 A | 10/1991 | Thornton | |
| 5,068,868 A * | 11/1991 | Deppe et al. ................. 372/45 |
| 5,068,869 A | 11/1991 | Wang et al. | |
| 5,079,774 A | 1/1992 | Mendez et al. | |
| 5,115,442 A | 5/1992 | Lee et al. | |
| 5,117,469 A | 5/1992 | Cheung et al. | |
| 5,140,605 A | 8/1992 | Paoli et al. | |
| 5,157,537 A | 10/1992 | Rosenblatt et al. | |
| 5,158,908 A | 10/1992 | Blonder et al. | |
| 5,206,872 A * | 4/1993 | Jewell et al. ............ 372/50.11 |

(Continued)

FOREIGN PATENT DOCUMENTS

DE          4240706 A1    6/1994

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635-644.

(Continued)

*Primary Examiner*—Minsun Oh Harvey
*Assistant Examiner*—Tuan N. Nguyen
(74) *Attorney, Agent, or Firm*—Workman Nydegger (57) ABSTRACT

A vertical cavity surface emitting laser having a dielectric gain guide. The gain guide may provide current confinement, device isolation and possibly optical confinement. The first mirror and an active region may be grown. A pattern may be placed on or near the active region. A dielectric material may be deposited on the pattern and the pattern may be removed resulting in a gain guide. Then a top mirror may be grown on the gain guide. This structure with the dielectric gain guide may have specific characteristics and/or additional features.

11 Claims, 6 Drawing Sheets

U.S. PATENT DOCUMENTS

| | | | |
|---|---|---|---|
| 5,212,706 A | 5/1993 | Jain | |
| 5,216,263 A | 6/1993 | Paoli | |
| 5,216,680 A | 6/1993 | Magnusson et al. | |
| 5,226,053 A * | 7/1993 | Cho et al. | 372/45 |
| 5,237,581 A | 8/1993 | Asada et al. | |
| 5,245,622 A | 9/1993 | Jewell et al. | |
| 5,258,990 A | 11/1993 | Olbright et al. | |
| 5,262,360 A | 11/1993 | Holonyak, Jr. et al. | |
| 5,285,466 A | 2/1994 | Tabatabaie | |
| 5,293,392 A | 3/1994 | Shieh et al. | |
| 5,317,170 A | 5/1994 | Paoli | |
| 5,317,587 A | 5/1994 | Ackley et al. | |
| 5,325,386 A | 6/1994 | Jewell et al. | |
| 5,331,654 A | 7/1994 | Jewell et al. | |
| 5,337,074 A | 8/1994 | Thornton | |
| 5,337,183 A | 8/1994 | Rosenblatt et al. | |
| 5,349,599 A | 9/1994 | Larkins | |
| 5,351,256 A | 9/1994 | Schneider et al. | |
| 5,359,447 A | 10/1994 | Hahn et al. | |
| 5,359,618 A | 10/1994 | Lebby et al. | |
| 5,363,397 A | 11/1994 | Collins et al. | |
| 5,373,520 A | 12/1994 | Shoji et al. | |
| 5,373,522 A | 12/1994 | Holonyak, Jr. et al. | |
| 5,376,580 A | 12/1994 | Kish et al. | |
| 5,386,426 A | 1/1995 | Stephens | |
| 5,390,209 A | 2/1995 | Vakhshoori | |
| 5,396,508 A | 3/1995 | Bour et al. | |
| 5,404,373 A | 4/1995 | Cheng | |
| 5,412,678 A | 5/1995 | Treat et al. | |
| 5,412,680 A | 5/1995 | Swirhun et al. | |
| 5,416,044 A | 5/1995 | Chino et al. | |
| 5,428,634 A | 6/1995 | Bryan et al. | |
| 5,438,584 A | 8/1995 | Paoli et al. | |
| 5,446,754 A | 8/1995 | Jewell et al. | |
| 5,465,263 A | 11/1995 | Bour et al. | |
| 5,475,701 A * | 12/1995 | Hibbs-Brenner | 372/50 |
| 5,493,577 A | 2/1996 | Choquette et al. | |
| 5,497,390 A | 3/1996 | Tanaka et al. | |
| 5,513,202 A | 4/1996 | Kobayashi et al. | |
| 5,530,715 A | 6/1996 | Shieh et al. | |
| 5,555,255 A | 9/1996 | Kock et al. | |
| 5,557,626 A | 9/1996 | Grodinski et al. | |
| 5,561,683 A | 10/1996 | Kwon | |
| 5,567,980 A | 10/1996 | Holonyak, Jr. et al. | |
| 5,568,498 A | 10/1996 | Nilsson | |
| 5,568,499 A | 10/1996 | Lear | |
| 5,574,738 A * | 11/1996 | Morgan | 372/28 |
| 5,581,571 A | 12/1996 | Holonyak, Jr. et al. | |
| 5,586,131 A | 12/1996 | Ono et al. | |
| 5,590,145 A | 12/1996 | Nitta | |
| 5,598,300 A | 1/1997 | Magnusson et al. | |
| 5,606,572 A | 2/1997 | Swirhun et al. | |
| 5,625,729 A | 4/1997 | Brown | |
| 5,642,376 A | 6/1997 | Olbright et al. | |
| 5,645,462 A | 7/1997 | Banno et al. | |
| 5,646,978 A | 7/1997 | Kem et al. | |
| 5,648,978 A | 7/1997 | Sakata | |
| 5,679,963 A | 10/1997 | Klem et al. | |
| 5,692,083 A | 11/1997 | Bennett | |
| 5,696,023 A | 12/1997 | Holonyak, Jr. et al. | |
| 5,699,373 A | 12/1997 | Uchida et al. | |
| 5,712,188 A | 1/1998 | Chu et al. | |
| 5,719,891 A * | 2/1998 | Jewell | 372/46.013 |
| 5,724,374 A * | 3/1998 | Jewell | 372/45.01 |
| 5,726,805 A | 3/1998 | Kaushik et al. | |
| 5,727,013 A | 3/1998 | Botez et al. | |
| 5,727,014 A | 3/1998 | Wang et al. | |
| 5,774,487 A * | 6/1998 | Morgan | 372/45 |
| 5,778,018 A | 7/1998 | Yoshikawa et al. | |
| 5,781,575 A | 7/1998 | Nilsson | |
| 5,784,399 A | 7/1998 | Sun | |
| 5,790,733 A | 8/1998 | Smith et al. | |
| 5,805,624 A | 9/1998 | Yang et al. | |
| 5,818,066 A | 10/1998 | Duboz | |
| 5,828,684 A | 10/1998 | Van de Walle | |
| 5,838,705 A | 11/1998 | Shieh et al. | |
| 5,838,715 A | 11/1998 | Corzine et al. | |
| 5,892,784 A | 4/1999 | Tan et al. | |
| 5,892,787 A | 4/1999 | Tan et al. | |
| 5,896,408 A | 4/1999 | Corzine et al. | |
| 5,901,166 A | 5/1999 | Nitta et al. | |
| 5,903,588 A | 5/1999 | Guenter et al. | |
| 5,903,589 A | 5/1999 | Jewell | |
| 5,903,590 A | 5/1999 | Hadley et al. | |
| 5,908,408 A | 6/1999 | McGary et al. | |
| 5,936,266 A | 8/1999 | Holonyak, Jr. et al. | |
| 5,940,422 A | 8/1999 | Johnson | |
| 5,953,362 A | 9/1999 | Pamulapati et al. | |
| 5,978,401 A | 11/1999 | Morgan | |
| 5,978,408 A | 11/1999 | Thornton | |
| 5,985,683 A * | 11/1999 | Jewell | 438/22 |
| 5,995,531 A | 11/1999 | Gaw et al. | |
| 6,002,705 A | 12/1999 | Thornton | |
| 6,008,675 A | 12/1999 | Handa | |
| 6,014,395 A * | 1/2000 | Jewell | 372/45.01 |
| 6,043,104 A | 3/2000 | Uchida et al. | |
| 6,046,065 A | 4/2000 | Goldstein et al. | |
| 6,052,398 A | 4/2000 | Brillouet et al. | |
| 6,055,262 A | 4/2000 | Cox et al. | |
| 6,060,743 A | 5/2000 | Sugiyama et al. | |
| 6,075,804 A * | 6/2000 | Deppe et al. | 372/96 |
| 6,078,601 A | 6/2000 | Smith | |
| 6,086,263 A | 7/2000 | Selli et al. | |
| 6,133,590 A | 10/2000 | Ashley et al. | |
| 6,144,682 A * | 11/2000 | Sun | 372/45 |
| 6,154,480 A | 11/2000 | Magnusson et al. | |
| 6,160,834 A * | 12/2000 | Scott | 372/96 |
| 6,185,241 B1 * | 2/2001 | Sun | 372/96 |
| 6,191,890 B1 | 2/2001 | Baets et al. | |
| 6,208,681 B1 | 3/2001 | Thorton | |
| 6,212,312 B1 | 4/2001 | Grann et al. | |
| 6,233,267 B1 * | 5/2001 | Nurmikko et al. | 372/46.014 |
| 6,238,944 B1 | 5/2001 | Floyd | |
| 6,269,109 B1 | 7/2001 | Jewell | |
| 6,297,068 B1 | 10/2001 | Thornton | |
| 6,302,596 B1 | 10/2001 | Cohen et al. | |
| 6,339,496 B1 | 1/2002 | Koley et al. | |
| 6,369,403 B1 | 4/2002 | Holonyak, Jr. | |
| 6,372,533 B2 | 4/2002 | Jayaraman et al. | |
| 6,392,257 B1 | 5/2002 | Ramdani et al. | |
| 6,410,941 B1 | 6/2002 | Taylor et al. | |
| 6,411,638 B1 | 6/2002 | Johnson et al. | |
| 6,427,066 B1 | 7/2002 | Grube | |
| 6,455,879 B1 | 9/2002 | Ashley et al. | |
| 6,459,709 B1 | 10/2002 | Lo et al. | |
| 6,459,713 B2 | 10/2002 | Jewell | |
| 6,462,360 B1 | 10/2002 | Higgins, Jr. et al. | |
| 6,472,694 B1 | 10/2002 | Wilson et al. | |
| 6,477,285 B1 | 11/2002 | Shanley | |
| 6,487,230 B1 | 11/2002 | Boucart et al. | |
| 6,487,231 B1 | 11/2002 | Boucart et al. | |
| 6,490,311 B1 | 12/2002 | Boucart et al. | |
| 6,493,371 B1 | 12/2002 | Boucart et al. | |
| 6,493,372 B1 | 12/2002 | Boucart et al. | |
| 6,493,373 B1 | 12/2002 | Boucart et al. | |
| 6,496,621 B1 | 12/2002 | Kathman et al. | |
| 6,498,358 B1 | 12/2002 | Lach et al. | |
| 6,501,973 B1 | 12/2002 | Foley et al. | |
| 6,515,308 B1 | 2/2003 | Kneissl et al. | |
| 6,535,541 B1 | 3/2003 | Boucart et al. | |
| 6,536,959 B2 | 3/2003 | Kuhn et al. | |
| 6,542,531 B2 | 4/2003 | Sirbu et al. | |
| 6,567,435 B1 | 5/2003 | Scott et al. | |
| 2001/0004414 A1 | 6/2001 | Kuhn et al. | |

| | | | |
|---|---|---|---|
| 2002/0154675 | A1 | 10/2002 | Deng et al. |
| 2003/0072526 | A1 | 4/2003 | Kathman et al. |

FOREIGN PATENT DOCUMENTS

| | | |
|---|---|---|
| EP | 0288184 A2 | 10/1988 |
| EP | 0776076 A1 | 5/1997 |
| JP | 60123084 | 1/1985 |
| JP | 02054981 | 2/1990 |
| JP | 5299779 | 11/1993 |
| WO | WO98/57402 | 12/1998 |

OTHER PUBLICATIONS

Bowers et al., "Fused Vertical Cavity Lasers With Oxide Aperture", Final report for MICRO project 96-042, Industrial Sponsor: Hewlett Packard, 4 pages, 1996-97.

Catchmark et al., "High Temperature CW Operation of Vertical Cavity Top Surface-Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83-120.

Choe, et al., "Lateral oxidation of AIAs layers at elevated water vapour pressure using a closed-chamber system," Letter to the Editor, Semiconductor Science Technology, 15, pp. L35-L38, Aug. 2000.

Choa et al., "High-Speed Modulation of Vertical-Cavity Surface-Emitting Lasers", *IEEE Photonics Technology Letter*, vol. 3, No. 8, Aug. 1991, pp. 697-699.

Choquette et al., "High Single Mode Operation from Hybrid Ion Implanted/Selectively Oxidized VCSELs", 200 IEEE 17th International Semiconductor Laser Conference, Monterrey, CA pp. 59-60.

Choquette et al., "Lithographically-Defined Gain Apertures Within Selectively Oxidized VCSELs", paper CtuL6, Conference on Lasers and Electro-Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low-Threshold 1.57- μm VC-SEL's Using Strain-Compensated Quantum Wells and Oxide/Metal Backmirror," IEEE Photonics Technology Letters, vol. 7, No. 5, pp. 444-446, May 1995.

Chua, et al., "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Cox, J. A., et al., "Guided Mode Grating Resonant Filters for VCSEL Applications", *Proceedings of the SPIE*, The International Society for Optical Engineering, Diffractive and Holographic Device Technologies and Applications V, San Jose, California, Jan. 28-29, 1998, vol. 3291, pp. 70-71.

Farrier, Robert G., "Parametric control for wafer fabrication; New CIM techniques for data analysis," Solid State Technology, pp. 99-105, Sep. 1997.

Fushimi, et al., "Degradation Mechanism in Carbon-doped GaAs Minority-carrier Injection Devices," 34th Annual IRPS Proceedings, Dallas, TX., Apr. 29-May 2, 1996, 8 pages.

G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.

G. Shtengel et al., "High-Speed Vertical-Cavity Surface-Emitting Lasers", *Photon. Tech. Lett.*, vol. 5, No. 12, pp. 1359-1361 (Dec. 1993).

Geib, et al., "Comparison of Fabrication Approaches for Selectively Oxidized VCSEL Arrays," Proceedings of SPIE, vol. 3946, pp. 36-40, 2000.

Graf, Rudolph, *Modern Dictionary of Electronics*, 6th ed., Indiana: Howard W. Sams & Company, 1984, p. 694.

Guenter et al., "Reliability of Proton-Implanted VCSELs for Data Communications", Invited paper, *SPIE*, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.

Hawthorne, et al., "Reliability Study of 850 nm VCSELs for Data Communications," IEEE, pp. 1-11, May 1996.

Herrick, et al., "Highly reliable oxide VCSELs manufactured at HP/Agilent Technologies," Invited Paper, Proceedings of SPIE vol. 3946, pp. 14-19, 2000.

Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.

Hideaki Saito, et al., "Controlling polarization of quantum-dot surface-emitting lasers by using structurally anisotropic self-assembled quantum dots," American Institute of Physics, Appl, Phys. Lett. 71 (5), pp. 590-592, Aug. 4, 1997.

Hornak et al., "Low-Termperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Huffaker et al., "Lasing Characteristics of Low Threshold Microcavity Layers Using Half-Wave Spacer Layers and Lateral Index Confinement", *Appl. Phys. Lett.*, vol. 66, No. 14, pp. 1723-1725, Apr. 3, 1995.

Jewell et al., "Surface Emitting Microlasers for Photonic Switching & Intership Connections", *Optical Engineering*, vol. 29, No. 3, pp. 210-214, Mar. 1990.

Jiang et al., "High-Frequency Polarization Self-Modulation in Vertical-Cavity Surface-Emitting Lasers", *Appl. Phys. Letters*, vol. 63, No. 26, Dec. 27, 1993, pp. 2545-2547.

K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.

Kash, et al., "Recombination in GaAs at the AIAs oxide-GaAs interface," Applied Physics Letters, vol. 67, No. 14, pp. 2022-2024, Oct. 2, 1995.

Kishino et al., "Resonant Cavity-Enhanced (RCE) Photodetectors", *IEEE Journal of Quantum Electronics*, vol. 27, No. 8, pp. 2025-2034.

Koley B., et al., "Dependence of lateral oxidation rate on thickness of AIAs layer of interest as a current aperture in vertical-cavity surface-emitting laser structures", Journal of Applied Physics, vol. 84, No. 1, pp. 600-605, Jul. 1, 1998.

Kuchibhotla et al., "Low-Voltage High Gain Resonant_Cavity Avalanche Photodiode", *IEEE Phototonics Technology Letters*, vol. 3, No. 4, pp. 354-356.

Lai et al., "Design of a Tunable GaAs/AlGaAs Multiple-Quantum-Well Resonant Cavity Photodetector", *IEEE Journal of Quantum Electronics*, vol. 30, No. 1, pp. 108-114.

Lee et al., "Top-Surface Emitting GaAs Four-Quantum-Well Lasers Emitting at 0-85 um", *Electronics Letters*, vol. 24, No. 11, May 24, 1990, pp. 710-711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251-1252.

Maeda, et al., "Enhanced Glide of Dislocations in GaAs Single Crystals by Electron Beam Irradiation," Japanese Journal of Applied Physics, vol. 20, No. 3, pp. L165-L168, Mar. 1981.

Magnusson, "Integration of Guided-Mode Resonance Filters and VCSELs", Electo-Optics Research Center, Department of Electrical Engineering, University of Texas at Arlington, May 6, 1997.

Martinsson et al., "Transverse Mode Selection in Large-Area Oxide-Confined Vertical-Cavity Surface-Emitting Lasers Using a Shallow Surface Relief", *IEEE Photon. Technol. Lett.*, 11(12), 1536-1538 (1999).

Miller et al., "Optical Bistability Due to Increasing Absorption", *Optics Letters*, vol. 9, No. 5, May 1984, pp. 162-164.

Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", *IEEE Photonics Technology Letters*, vol. 7, No. 5, May 1995, pp. 441-443.

Morgan et al., "High-Power Coherently Coupled 8x8 Vertical Cavity Surface Emitting Laser Array", *Appl. Phys Letters*, vol. 61, No. 10, Sep. 7, 1992, pp. 1160-1162.

Morgan et al., "Hybrid Dielectric/AlGaAs Mirror Spatially Filtered Vertical Cavity Top-Surface Emitting Laser", *Appl. Phys. Letters*, vol. 66, No. 10, Mar. 6, 1995, pp. 1157-1159.

Morgan et al., "Novel Hibrid-DBR Single-Mode Controlled GaAs Top-Emitting VCSEL with Record Low Voltage", 2 pages, dated prior to Dec. 29, 2000.

Morgan et al., "One Watt Vertical Cavity Surface Emitting Laser", *Electron. Lett.*, vol. 29, No. 2, pp. 206-207, Jan. 21, 1993.

Morgan et al., "Producible GaAs-based MOVPE-Grown Vertical-Cavity Top-Surface Emitting Lasers with Record Performance", *Elec. Lett.*, vol. 31, No. 6, pp. 462-464, Mar. 16, 1995.

Morgan et al., "Progress and Properties of High-Power Coherent Vertical Cavity Surface Emitting Laser Arrays", *SPIE*, Vo. 1850, Jan. 1993, pp. 100-108.

Morgan et al., "Progress in Planarized Vertical Cavity Surface Emitting Laser Devices and Arrays", *SPIE*, vol. 1562, Jul. 1991, pp. 149-159.

Morgan et al., "Spatial-Filtered Vertical-Cavity Top Surface-Emitting Lasers", CLEO, 1993, pp. 138-139.

Morgan et al., "Submilliamp, Low-Resistance, Continuous-Wave, Single-Mode GaAs Planar Vertical-Cavity Surface Emitting Lasers", Honeywell Technology Center, Jun. 6, 1995.

Morgan et al., "Transverse Mode Control of Vertical-Cavity Top-Surface Emitting Lasers", *IEEE Photonics Technology Letters*, vol. 4, No. 4, Apr. 1993, pp. 374-377.

Morgan et al., "Vertical-cavity surface-emitting laser arrays", Invited Paper, *SPIE*, vol. 2398, Feb. 6, 1995, pp. 65-93.

Morgan et al., Vertical-cavity surface emitting lasers come of age, Invited paper, *SPIE*, vol. 2683, 0-8194-2057, Mar. 1996, pp. 18-29.

Morgan, "High-Performance, Producible Vertical Cavity Lasers for Optical Interconnects", *High Speed Electronics and Systems*, vol. 5, No. 4, Dec. 1994, pp. 65-95.

Naone R.L., et al., "Tapered-apertures for high-efficiency miniature VCSELs", LEOS newsletter, vol. 13, No. 4, pp. 1-5, Aug. 1999.

Nugent et al., "Self-Pulsations in Vertical-Cavity Surface-Emitting Lasers", *Electronic Letters*, vol. 31, No. 1, Jan. 5, 1995, pp. 43-44.

Oh, T. H. et al., "Single-Mode Operation in Antiguided Vertical-Cavity Surface-Emitting Laser Using a Low-Temperature Grown AlGaAs Dielectric Aperture", *IEEE Photon. Technol. Lett*, 10(8), 1064-1066 (1998).

Osinski, et al., "Temperature and Thickness Dependence of Steam Oxidation of AlAs in Cylindrical Mesa Structure," IEEE Photonics Technology Letters, vol. 13, No. 7, pp. 687-689, Jul. 2001.

Peck, D. Stewart, Comprehensive Model for Humidity Testing Correlation, IEEE/IRPS, pp. 44-50, 1986.

Ries, et al., "Visible-spectrum ($\lambda$=650nm) photopumped (pulsed, 300 K) laser operation of a vertical-cavity AlAs-AlGaAs/InAlP-InGaP quantum well heterostructure utilizing native oxide mirrors," Applied Physics Letters, vol. 67, No. 8, pp. 1107-1109, Aug. 21, 1995.

S.S. Wang and R. Magnusson, "Multilayer Waveguide-Grating Filters", *Appl. Opt.*, vol. 34, No. 14, pp. 2414-2420, 1995.

S.S. Wang and R. Magnusson, "Theory and Applications of Guided-Mode Resonance Filters", *Appl. Opt.*, vol. 32, No. 14, pp. 2606-2613, 1993.

Sah, et al., "Carrier Generation and Recombination in *P-N* Junctions and *P-N* Junction Characteristics," Proceedings of the IRE, pp. 1228-1243, Sep. 1957.

Schubert, "Resonant Cavity Light-Emitting Diode", *Appl. Phys. Lett.*, vol. 60, No. 8, pp. 921-923, Feb. 24, 1992.

Shi, et al., "Photoluminescence study of hydrogenated aluminum oxide-semiconductor interface," Applied Physics Letters, vol. 70, No. 10, pp. 1293-1295, Mar. 10, 1997.

Smith, R.E. et al., Polarization-Sensitive Subwavelength Antireflection Surfaces on a Semiconductor for 975 NM, *Optics Letters*, vol. 21, No. 15, Aug. 1, 1996, pp. 1201-1203.

Spicer, et al., "The Unified Model For Schottky Barrier Formation and MOS Interface States in 3-5 Compounds," Applications of Surface Science, vol. 9, pp. 83-101, 1981.

Suning Tang et al., "Design Limitations of Highly Parallel Free-Space Optical Interconnects Based on Arrays of Vertical Cavity Surface-Emitting Laser Diodes, Microlenses, and Photodetectors", Journal of Lightwave Technology, vol. 12, No. 11, Nov. 1, 1994, pp. 1971-1975.

T. Mukaihara, "Polarization Control of Vertical-cavity Surface-Emitting Lasers by a Birefringent Metal/Semiconductor Polarizer Terminating a Distributed Bragg Reflector," Tokyo Institute of Technology, Precision and Intelligence Laboratory, pp. 183-184.

Tao, Andrea, "Wet-Oxidation of Digitally Alloyed AlGaAs," National Nanofabrication Users Network, Research Experience for Undergraduates 2000, 2 pages.

Tautm, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface-Emitting Lasers," Japan J. Appl. Phys. vol. 33 (1994) pp. L227-L229, Part 2, No. 2B, Feb. 15, 1994.

Tu, Li-Wei et al., "Transparent conductive metal-oxide contacts in vertical-injection top-emitting quantum well lasers", Appl. Phys. Lett. 58 (8) Feb. 25, 1991, pp. 790-792.

Wieder, H.H., "Fermi level and surface barrier of $Ga_xIn_{1-x}As$ alloys," Applied Physics Letters, vol. 38, No. 3, pp. 170-171, Feb. 1, 1981.

Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.

Y. M. Yang et al., "Ultralow Threshold Current Vertical Cavity Surface Emitting Lasers Obtained with Selective Oxidation", *Elect. Lett.*, vol. 31, No. 11, pp. 886-888, May 25, 1995.

Yablonovitch et al., "Photonic Bandgap Structures", *J. Opt. Soc. Am. B.*, vol. 10, No. 2, pp. 283-295, Feb. 1993.

Young et al., "Enhanced Performance of Offset-Gain High Barrier Vertical-Cavity Surface-Emitting Lasers", *IEEE J. Quantum Electron.*, vol. 29, No. 6, pp. 2013-2022, Jun. 1993.

U.S. Appl. No. 09/751,422, filed Dec. 29, 2000, entitled "Resonant Reflector for Use with Optoelectronic Devices".

U.S. Appl. No. 09/751,423, filed Dec. 29, 2000, entitled "Spatially Modulated Reflector for an Optoelectronic Device".

* cited by examiner

DIELECTRIC VCSEL GAIN GUIDE

BACKGROUND

The invention pertains to laser light sources and particularly to vertical cavity surface emitting lasers. More particularly, the invention pertains to long wavelength lasers.

A vertical cavity surface emitting laser (VCSEL) may include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL may be driven by a current forced through the active region, typically achieved by providing a first contact on the reverse side of the substrate and a second contact on top of the second mirror stack. The first contact may instead be on top of the first mirror stack in a coplanar arrangement.

VCSEL mirror stacks are generally formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs/GaAs or AlAs/AlGaAs material system wherein the different refractive index of each layer of a pair may be, for example, achieved by altering the aluminum content in the layers. In some devices, the number of mirror pairs per stack may range from 20 to 60 to achieve a high percentage of reflectivity, depending on the difference between the refractive indices of the layers. A larger number of pairs may increase the percentage of reflected light.

In many VCSELS, conventional material systems may perform adequately. However, new products are being developed requiring VCSELs to emit light having long wavelengths. VCSELs emitting light having a long wavelength are of great interest in the optical telecommunications industry because of the low fiber dispersion at 1310 nanometers (nm) and the low fiber loss at 1550 nm. For instance, a long wavelength VCSEL may be obtained by using a structure having an InGaAs/InGaAsP (or InAlGaAs) active region. When an InGaAs/InGaAsP active region is used, an InP/InGaAsP (or InAlGaAs/InAlAs or InAlGaAs/InP) material system needs to be used for the mirror stacks in order to achieve a lattice match relative to the InP substrate. The lattice matching between the substrate and the layers should be substantially close to ensure a true single crystal film or layer growth.

In the InP material based system, it is difficult to achieve a suitable monolithic DBR-based mirror structure having a reasonable thickness because of the insignificant difference in the refractive indices in this material system. As a result, many layers, or mirror pairs, are needed in order to achieve useful reflectivity. Useful reflectivity may be 99.8 percent or greater. Numerous attempts have been made to address the problem of very thick mirror structures. One attempt included a wafer bonding technique in which a DBR mirror is grown on a separate substrate and bonded to the active region. This technique has had only limited success and also the interface defects density in the wafer fusion procedure causes potential reliability problems. Other approaches to making satisfactory long wavelength VCSELs have been fraught with one problem or another. For instance, lattice matched InP based mirrors used for 1550 nm VCSELs have a host of problems in growth, processing, and optical performance. The low index contrast of InGaAsP (or InAlGaAs) and InP (or InAlAs) leads to the requirement of extremely thick (ten microns or thicker) DBRs of 45 or more mirror periods or layer pairs. The AlGaAsSb or AlGaPSb systems associated with an InP substrate may be difficult to grow by MOCVD, and with good contrast, may still require at least 25 mirror pairs to achieve adequate reflectivity for VCSEL operation. For some VCSEL structures, such as those having a long wavelength, current confinement is an important characteristic. Proton implantation and lateral oxidation have been developed and used for current confinement in vertical cavity surface emitting lasers (VCSELs), especially GaAs-based VCSELs. For some VCSELs, however, proton implantation and lateral oxidation cannot be easily applicable due to either very thick top DBR stacks for proton implantation or lack of lattice-matched high aluminum containing material for oxidation, respectively. This is particularly the case of InP related materials for long wavelength VCSEL operation. For InP based material systems, since index contrasts are relatively small as compared to GaAs based counterparts, the DBR stacks tend to be much thicker to provide reasonable reflectivity. Consequently, large amounts of energy are required for gain guide proton implantation, which is not practical. Such energy levels may damage other parts of the structure. Also, the aluminum content is significantly lower in materials lattice matched to InP substrates than in those materials lattice matched to GaAs substrates. The low aluminum content makes lateral oxidation difficult. Thus, an alternative to implantation and oxidation for making a gain guide is needed. The invention provides that alternative.

SUMMARY

The invention may involve a vertical cavity surface emitting laser having an InP substrate, a first mirror situated on the substrate, an active region situated on the first mirror, a gain guide formed on the active region and a second mirror situated on the gain guide.

To circumvent the problems indicated above, a dielectric layer can be used as a gain guide by depositing a dielectric material such as silicon oxide, silicon nitride, or the like, in an appropriate pattern between the cavity and top DBR. The dielectric layer can be used not only for current confinement but also for optical confinement if a proper dielectric material is chosen.

If an epitaxial growing mechanism is also equipped with a dielectric material deposition tool, both epitaxial semiconductor and dielectric layers may be grown in one step. However, many semiconductor epitaxial growth mechanisms or tools are not capable of depositing dielectric materials. Also, patterning may be required before the dielectric material deposition. The over growth technique may be applicable to inserting a dielectric layer between the semiconductor layers. First, bottom DBRs and a cavity/active layer may be grown on a substrate. The epitaxial growth may be interrupted and a dielectric material layer deposited on the semiconductor layers, followed by patterning. The patterned sample may then be loaded back to the chamber for top DBR growth. Over growth may occur on a semiconductor surface and then on a dielectric surface by a lateral epitaxial over growth.

DESCRIPTION

Figure 1:
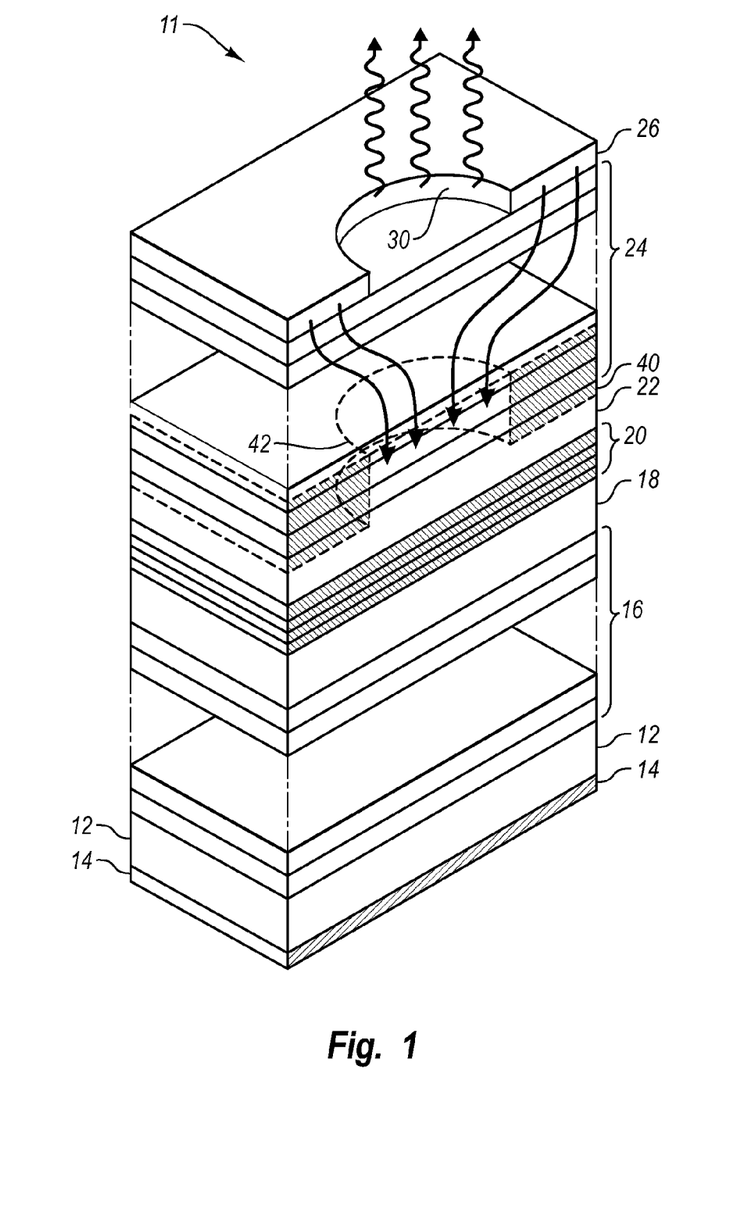
FIG. 1 illustrates a vertical cavity surface emitting laser (VCSEL)

FIG. 1 is a representation showing a perspective illustration of a structure for a vertical cavity surface emitting laser 11. A substrate 12 may be disposed on an electrical contact 14. A first mirror stack 16 and a bottom graded index region 18 may be progressively disposed, in layers, on substrate 12. A quantum well active region 20 may be formed and a top graded index region 22 may be disposed over active region 20. A top mirror stack 24 may be formed over the active region and a conductivity layer 26 may form an electrical contact. Current may flow from upper contact 26 to lower contact 14. This current may pass through active region 20. Upward arrows in FIG. 1 illustrate the passage of light through an aperture 30 in upper contact 26. The downward arrows illustrate the passage of current downward from upper contact 26 through upper mirror stack 24 and the active region 20. An ion (proton) implantation 40 may form an annular region of electrically resistant material. A central opening 42 of electrically conductive material may remain undamaged during the ion (proton) implantation process. As a result, current passing from upper contact 26 to lower contact 14 may be forced to flow through conductive opening 42 and thereby be selectively directed to pass through a preselected portion of active region 20. The current may flow through bottom mirror stack 16 and substrate 12 to lower contact 14. The current going through active region 20 may result in a generation of light with in a cavity constituted between top and bottom mirrors 16 and 24. Light may be eventually emitted by structure 11 out of aperture 30 as shown by the upward pointing arrows.

Figure 2:
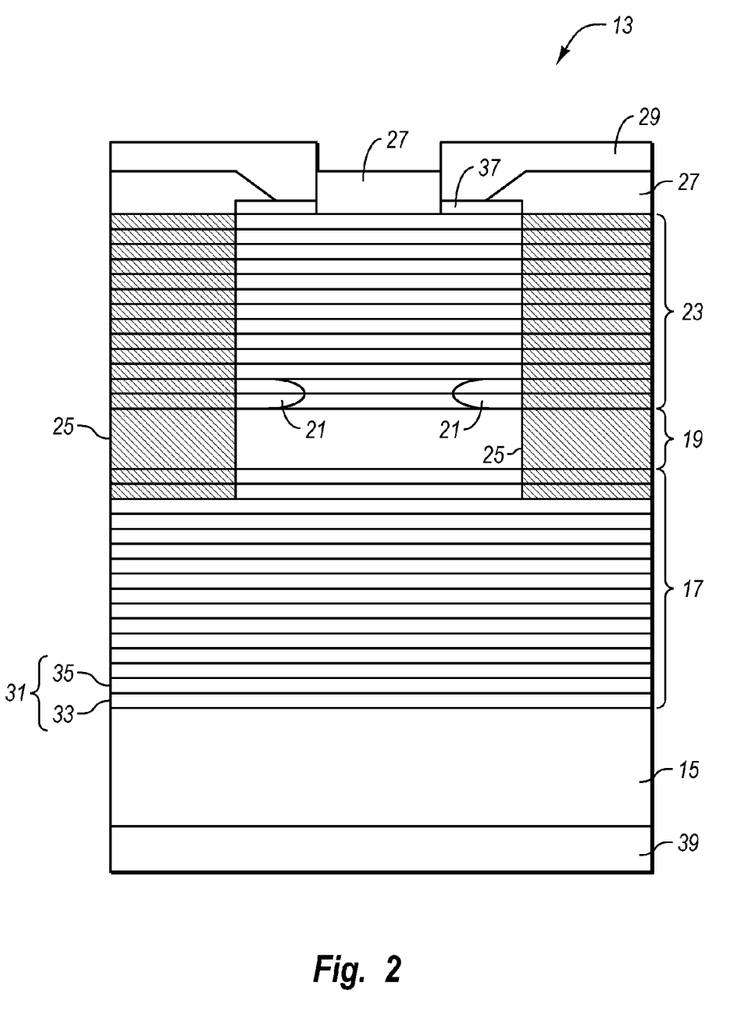
FIG. 2 reveals an illustrative example of a long wavelength InP material based VCSEL.
Figure 3:
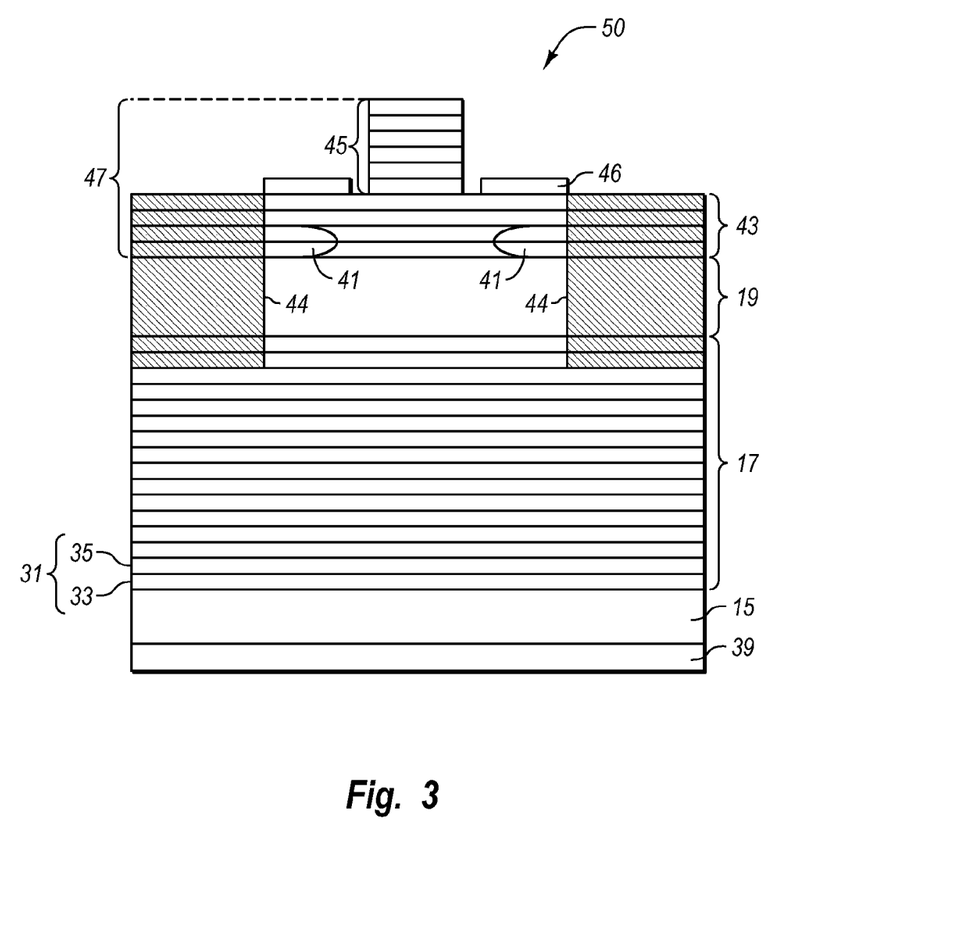
FIG. 3 reveals a VCSEL structure having a two part top mirror with proton implantation effected through just the lower part of the top mirror.
Figure 4:
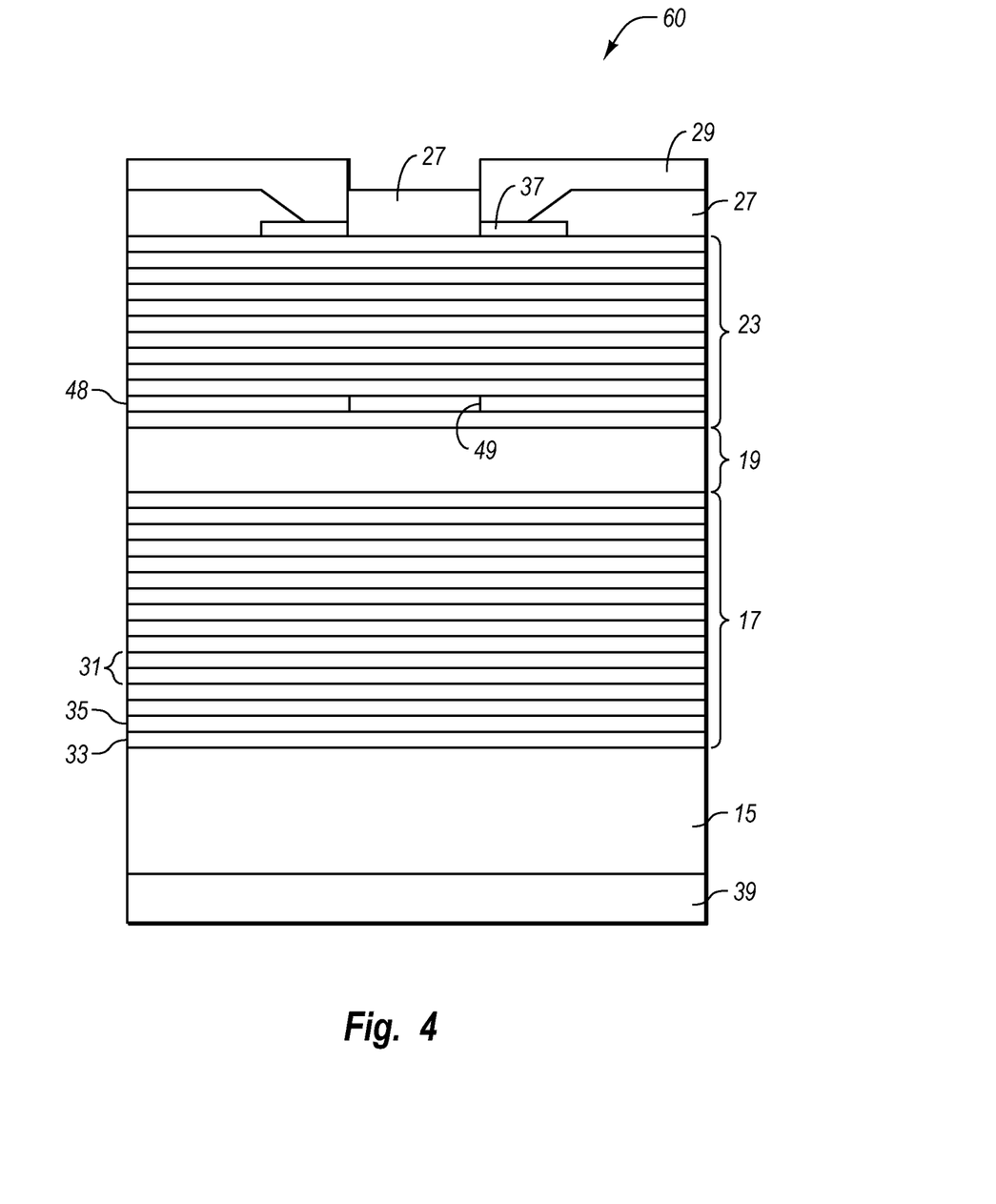
FIG. 4 shows a VCSEL structure utilizing lateral oxidation in at least one aluminum-containing layer in the top mirror for device isolation and current confinement.

FIGS. 2, 3 and 4 reveal several illustrative examples of long wavelength InP based VCSEL structures. A long wavelength may range from about 1200 nm through about 1800 nm. FIGS. 2, 3 and 4 are not necessarily drawn to scale. Structure 13 of FIG. 2 may be a full epitaxial proton implantation version. It may have an InP substrate 15. On substrate may be formed a lower or bottom mirror 17. Mirror 17 may be a distributed Bragg reflector (DBR) having a stack of pairs 31 of layers 33 and 35 of materials. Each pair 31 may be one-half wavelength thick. Each of the layers 33 and 35 may be one-fourth wavelength thick. The thicknesses may be optical wavelengths of the light emitted from structure 13, for the respective materials of layers 33 and 35. The two layers, 33 and 35, of each pair 31 may be composed of different materials. For example, layer 33 may be InAlGaAs and layer 35 may be InAlAs. These layers and pairs may be repeated in a mirror stack. Other pairs of materials for layers 33 and 35 may include InGaAsP and InP, InAlGaAs and InP, GaAsSb and AlAsSb, and GaAsSb and InP, respectively. There may also be other material pairs that may be appropriate for making DBR mirror 17.

Situated on bottom mirror 17, may be formed an active region or cavity 19. Region 19 may have between one and more than five quantum wells. The material for the active region may be InGaAs (or InAlGaAs with low Al content) for quantum wells and InAlGaAs with high Al content for barriers. On active region 19 may be formed an upper or top mirror 23. DBR mirror 23 may have the same structure of pairs 31 of layers 33 and 35 as that in bottom mirror 17.

Proton implantation may be applied at the lower part of mirror 23 to make a gain guide 21 to provide current guidance and confinement in VCSEL structure 13. A center portion on the top of mirror 23 may be masked with a material resistant to proton implantation. Then a proton implantation may be applied to the top of structure 13 resulting in an isolation 25. Since the indexes of refraction of each material of the pairs of layers are close to each other, then many more pairs 31 may be required to build the mirror with the needed 99.8 percent reflectivity. Consequently, top mirror is a quite thick epitaxial DBR. Thus, rather high energy is required to achieve proton implantation down far enough in mirror 23 to result in an effective isolation 25.

The mask may be removed from the central portion of top mirror 23. Another mask may be applied to the top mirror 23 with an opening for applying a contact metal 37 on the top of mirror 23. Structure 13 may be moved so the resultant contact metal 37 may be in the form of a ring. The mask may be removed after deposition for the contact metal 37. Another mask may be placed on a portion of the contact metal and a passivation layer 27 may be deposited on the top of structure 13. The mask may be removed and another mask may be formed on the center portion of passivation layer 27. A layer of contact metal may be applied on the masked top of structure 13. The mask from the center portion of passivation layer may be removed with the remaining contact metal resulting in a ring-like contact 29 connected to contact metal 37. Contact metal may be deposited on the bottom side of substrate 15 to result in a second contact 39 for VCSEL structure 13.

FIG. 3 shows a VCSEL structure 50 which may a regarded as a hybrid proton implantation version. As like structure 13 of FIG. 2, a mirror 17 may be formed on an InP substrate 15. The structure and materials used in the pairs 31 of layers 33 and 35 may be the same as those in structure 13. An active region on cavity 19, like that of structure 13, may be formed on mirror 17. An active region or cavity 19 may be formed on bottom mirror 17. On cavity 19, a first part 43 of mirror 47 may be formed on active layer or cavity 19. The material of pairs 31 of mirror part 43 may be the same as the pairs of bottom mirror 17 of this structure 50.

Proton implantation may be applied in a lower portion of mirror part 43 to make a gain guide 41 to provide current guidance and confinement in VCSEL structure 50.

Mirror part 43 may have fewer pairs 31 of layers 33 and 35 than bottom mirror 17 of this structure 50 or top mirror 23 of structure 13. One reason for the shorter mirror stack 43 may be to effect a proton implantation result in an isolation 44 requiring much less energy than the proton implantation required for making isolation 25 in structure 13.

On mirror part 43, another mirror part 45 may be formed. Mirror parts 43 and 45 constitute upper DBR mirror 47. Mirror part 45 is a dielectric mirror stack (DBR) 45 may be like a mesa or an island situated on lower mirror part or portion 43 of upper mirror 47. Mirror stack 45 may have, as examples, 3 to 4 pairs of $TiO_2$ and $SiO_2$, 2 to 3 pairs of Si and $Al_2O_3$, or 4 to 5 pairs of $TiO_2$ and $Al_2O_3$, respectively. The dielectric stack may cover the light aperture of VCSEL structure 50 and not block emitted light.

Formed around dielectric stack 45 may be a ring 46 of contact metal as a first contact 46 for VCSEL structure 50. Contact 46 may be deposited in a manner similar to that of contact 37 for structure 13. A second contact metal may be deposited on the bottom of InP substrate 15 as a second contact 39 for VCSEL structure 50. A disadvantage of structure 50 is the process for making it is complicated with stack 45 and related issues such as, for instance, stress in dielectric DBR stack 45.

FIG. 4 shows VCSEL structure 60 which may be regarded as a full epitaxial oxide version. Lateral oxidation in upper mirror 23 is resorted to for isolation and current confinement. On InP substrate 15, a DBR mirror 17 may be formed. Mirror 17 may have a stack of pairs 31 of layers 33 and 35 having material like that of mirror 17 in structure 13. An active region or cavity 19 may be formed on bottom DBR mirror 17. Active region 19 may have one to more than five quantum wells. The material of active region 19 may include material similar to that of region 19 in structure 13. A top mirror 23 may be formed on active region or cavity 19. Mirror 23 has a structure of pairs of layers of material like that of mirror 23 in structure 13. One thing different from structure 13 is that one or two of the layers of a pair 31, near active region 19 in mirror 23, may have a high content of aluminum. In other words, these layers are oxidizable and may be oxidized laterally under certain environmental conditions such as high water vapor and temperature. The result may be lateral oxidation 48 forming a gain guide 49 and providing isolation for VCSEL structure 60. Isolation 25 and a gain guide 49 as provided by proton implantation in structure 13 may be absent in structure 60. Contact metal 37 and passivation layer 27 are formed on the top of upper DBR mirror 23 in the same manner as it is formed for structure 13. An electrical contact 29, connected to contact metal 37, is made in the same manner as that for structure 13. Contact material may be deposited on the bottom of InP substrate 15 to provide a second electrical contact for VCSEL structure 60. One disadvantage relative to making the structure 60 version is the lack of ease of producing an appropriate lateral oxidation 48 to provide the desired gain guide 49.

Figure 5:
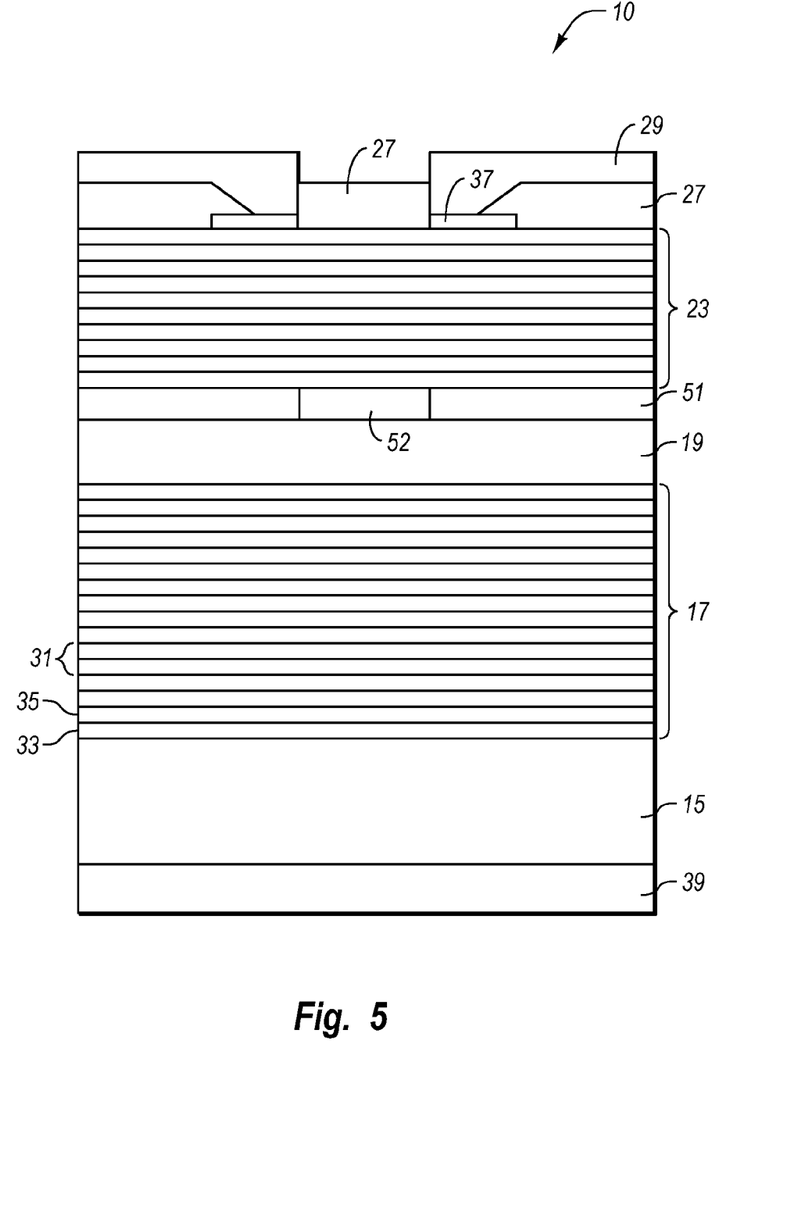
FIG. 5 reveals a VCSEL structure having a dielectric gain guide.

FIG. 5 reveals a VCSEL structure 10 having a dielectric gain guide 51. On an InP substrate 15 may be a bottom DBR mirror 17 having pairs 31 of layers 31 and 33 made in the same manner and having the same structure as that of structure 13. An active region or cavity 19 may be grown or formed on top of bottom mirror 17. Active region or cavity 19 may have the same materials and structure as the region or cavity 19 in structure 13. A gain guide having a pattern may be deposited on active region or cavity 19. The pattern may be for an aperture for current confinement and optical confinement. The pattern may be determined with a mask on active region or cavity 19. The material for dielectric gain guide 51 may be $SiO_2$, $TiO_2$, SiN and other appropriate dielectric materials. The deposition of dielectric material for gain guide 51 may be done between two epitaxial growths.

Figure 6A:
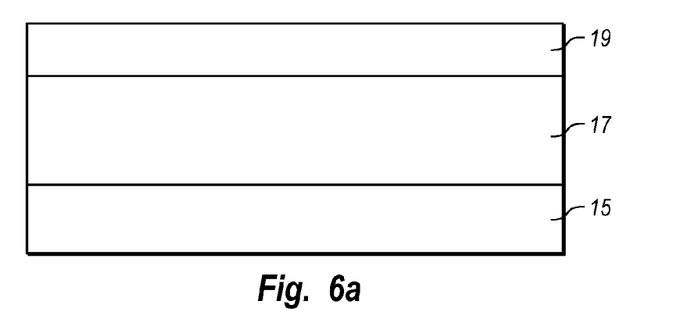
FIGS. 6a, 6b and 6c show a summary of stages for making a dielectric gain guide.
Figure 6B:
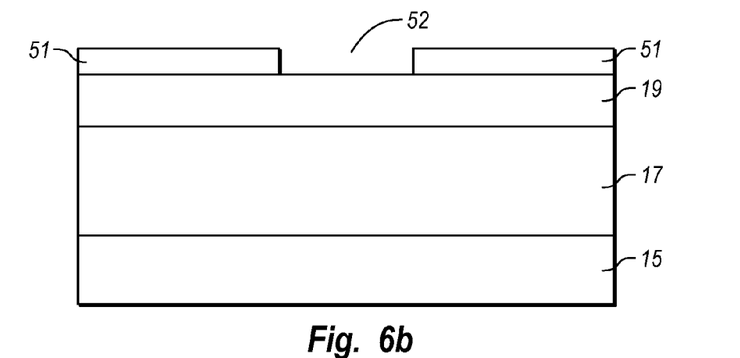
Figure 6C:
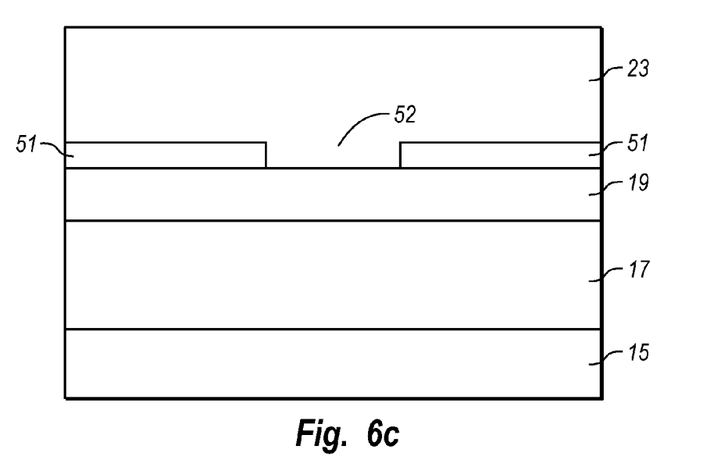

FIGS. 6a, 6b and 6c reveal the basic steps of the process for obtaining a dielectric gain guide in a VCSEL structure. The details of the structure may be noted in the preceding figures. First, as in FIG. 6a, may be a growth of the bottom mirror 17 on substrate 15. Active region and/or cavity 19 may be grown on bottom DBR mirror 17. Then one may mask cavity 19 in the area of an aperture 52 to use lift-off technique or deposit the dielectric and place a mask on the dielectric to etch out an aperture 52. FIG. 6b shows the results of the gain guide 51 masking and deposition. Upon depositing dielectric gain guide 51 layer and making aperture 52, then top DBR mirror 23 may be grown on layer 51 and active region 19 in aperture area 52, as shown in FIG. 6c. Aperture 52 or gain guide 51 may provide current and optical confinement. Optical confinement may not be needed. In summary, there may be the epitaxial growth in FIG. 6a, the dielectric deposition (and patterning) in FIG. 6b, and another epitaxial growth of the top DBR mirror 23. The growth of mirror 23 may be regarded as an over-growth. The dielectric deposition is between two epitaxial growths.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A long wavelength vertical cavity surface emitting laser (VCSEL) comprising:
    a first mirror comprising In and having at least about 25 mirror pairs;
    an active area situated above said first mirror, the active region comprising In and being configured to emit light at a long wavelength in a range from about 1200 nanometers to about 1800 nanometers;
    a dielectric layer situated above said active area and defining an electrically confining aperture, the dielectric layer having a configuration and a composition compatible with depositing the dielectric layer using a masking technique, wherein the dielectric layer comprises a dielectric material selected from the group consisting of $SiO_2$, $TiO_2$, SiN, and combinations thereof; and
    a second mirror above said dielectric gain guide, the second mirror comprising In and having at least about 25 mirror pairs.

2. The VCSEL of claim 1, further comprising:
    a substrate; and
    wherein said first mirror is situated above said substrate; and
    said substrate comprises InP.

3. The VCSEL of claim 2, wherein said non-aluminum dielectric material provides optical confinement.

4. The VCSEL of claim 1, further comprising:
    a substrate; and
    wherein:
        said mirror is situated above said substrate; and
        said substrate comprises GaAs.

5. The VCSEL of claim 4, wherein said non-aluminum dielectric material provides optical confinement.

6. The VCSEL of claim 5, wherein said non-aluminum dielectric material is selected from the group consisting of $SiO_2$, $TiO_2$, SiN, and combinations thereof.

7. A long wavelength vertical cavity surface emitting laser for providing laser light comprising:
    first reflecting means, situated above a substrate, for reflecting light;
    active means, situated above said first reflecting means, for converting current to light the active means being configured to emit light at a long wavelength in a range from about 1200 nanometers to about 1800 nanometers;
    confinement means, situated above said active means, for confining current, the confinement means having a configuration and a composition compatible with depositing the confinement means using a masking technique, wherein the confinement means comprises a dielectric material selected from the group consisting of $SiO_2$, $TiO_2$, SiN, and combinations thereof; and second reflecting means, situated above said confinement means, for reflecting light, the second reflecting means comprising a plurality of layers comprised of InP, InAlAs, or AlAsSb.

8. The vertical cavity surface emitting laser of claim 7, wherein said first means for reflecting comprises first distributed Bragg reflector layers including one or more materials that are at least nearly lattice matched with the substrate and wherein said second reflecting means comprises second distributed Bragg reflector layers.

9. The vertical cavity surface emitting laser of claim 8, wherein said active means is at least nearly lattice matched with said first means for reflecting.

10. The vertical cavity surface emitting laser of claim 9, wherein the substrate comprises InP.

11. The vertical cavity surface emitting laser of claim 9, wherein the substrate comprises GaAs.

* * * * *

UNITED STATES PATENT AND TRADEMARK OFFICE
CERTIFICATE OF CORRECTION

PATENT NO. : 7,277,461 B2
APPLICATION NO. : 10/607629
DATED : October 2, 2007
INVENTOR(S) : Ryou et al.

It is certified that error appears in the above-identified patent and that said Letters Patent is hereby corrected as shown below:

Page 4
(56) OTHER PUBLICATIONS, thirty first entry, change "fo" to --of--

Column 2
Line 51, change "over growth" to --overgrowth--
Line 58, change "Over growth" to --Overgrowth--
Line 60, change "over growth" to --overgrowth--

Column 3
Line 17, change "first" to --bottom--
Line 22, change "conductivity layer 26" to --conductivity layer, upper contact 26,--
Line 39, change "with in" to --within--
Line 40, change "mirrors" to --mirror stacks--
Line 49, change "substrate" to --substrate 15--

Column 4
Line 15, change "mirror" to --mirror 23--
Line 30, change "layer" to --layer 27--
Line 35, change "may a" to --may be--
Line 40, change "on" to --or--
Line 41, remove "An active region or cavity 19 may"
Line 42, remove "be formed on bottom mirror 17. On cavity 19," and change "a" to --A--
Line 51, change "stack" to --part--
Line 57, change "(DBR) 45" to --(DBR). Dielectric mirror stack 45--
Line 59, change "Mirror stack" to --stack 45--
Line 64, change "dielectric stack" to --stack 45--
Line 64, remove "46"
Line 67, change "contact 37" to --contact metal 37--

Signed and Sealed this

Ninth Day of November, 2010

David J. Kappos
*Director of the United States Patent and Trademark Office*

CERTIFICATE OF CORRECTION (continued)
U.S. Pat. No. 7,277,461 B2

Column 5
Line 26, change "49" to --21--
Line 33, change "contact" to --contact 39--
Line 39, change "31 and 33" to --33 and 35--
Line 55, remove "may be a"
Line 56, after "17" insert --may be--

Column 6
Claim 1, line 31, change "gain guide" to --layer--
Claim 7, line 57, change "light the" to --light, the--